United States Patent
Yan

(10) Patent No.: US 6,380,545 B1
(45) Date of Patent: Apr. 30, 2002

(54) UNIFORM RASTER PATTERN GENERATING SYSTEM

(75) Inventor: Chen Yan, Yorktown, VA (US)

(73) Assignee: Southeastern Universities Research Association, Inc., Newport News, VA (US)

( * ) Notice: Subject to any disclaimer, the term of this patent is extended or adjusted under 35 U.S.C. 154(b) by 0 days.

(21) Appl. No.: 09/385,803

(22) Filed: Aug. 30, 1999

(51) Int. Cl.⁷ ............................................. H01J 37/141
(52) U.S. Cl. ................. 250/396 ML; 250/398
(58) Field of Search ...................... 250/396 ML, 396 R, 250/398, 492.2

(56) References Cited

U.S. PATENT DOCUMENTS

| | | | | |
|---|---|---|---|---|
| 3,567,924 A | * | 3/1971 | Moisand et al. ............ | 250/398 |
| 4,238,826 A | * | 12/1980 | Jones et al. ................. | 364/515 |
| 4,380,703 A | * | 4/1983 | Schmitt ............... | 250/396 ML |
| 5,164,893 A | * | 11/1992 | Luscher et al. ............. | 363/137 |
| 5,420,100 A | * | 5/1995 | Vittoria et al. .............. | 505/162 |
| 5,488,272 A | * | 1/1996 | Cotton ........................ | 315/404 |
| 5,663,568 A | * | 9/1997 | Waskiewicz ................ | 250/398 |

* cited by examiner

Primary Examiner—Bruce C. Anderson

(57) ABSTRACT

A conventional particle generation and magnet configuration are used in combination with a relatively low-power power amplifier, a resonant loop magnet driver system, an amplitude modulator that induces a homogeneous amplitude function proportional to $(t)^{1/2}$ and, when individual X and Y magnets are used, a precision phase shifter that induces a 90° phase shift in the applied power to one of the magnets to produce a circular raster pattern of virtually uniform density.

19 Claims, 2 Drawing Sheets

UNIFORM RASTER PATTERN GENERATING SYSTEM

FIELD OF THE INVENTION

The present invention relates to a low cost, reliable system for generating uniform or homogenous raster patterns. The system is also useful for the generation of homogeneous pattern distributions of charged particles or rays of any type where magnets are used to obtain the required distribution.

BACKGROUND OF THE INVENTION

The need to generate uniform or homogeneous raster patterns of electron beams directed at cryogenic targets such as liquid hydrogen, liquid deuterium, liquid helium, etc. in order to minimize localized heating and concomitant boiling is well known to those skilled in the art of particle accelerator operation. Similar requirements exist in such industrial applications as ion implantation and in medical therapy using charged particle beams. Common sinusoidal raster systems, for example, produce a beam pattern that because of the return points of the track produce higher beam densities along either the raster boundaries or at the corners of the raster pattern.

A variety of solutions have been proposed to solve this problem including the generation of circular, spiral and even triangular patterns. For example, Y. K. Batygin, et al in Nuclear Instruments and Methods in Physics Research A, 1995 pgs. 128–130 suggests a circular sweep of a particle beam over a target for making a uniform irradiation zone. The scan pattern is an untwisted spiral for a continuous beam or a family of concentric circles for a bunched beam. The deflection voltage provided by the RF cavities with orthogonal transverse fields shifted in time by $\pi/2$. The amplitude of the deflection voltage is a function of the time and the optimum beam scan frequency with respect to the RF frequency of the accelerator are also defined.

M. Fukuda et al in Nuclear Instruments and Methods on Physics Research A 396, (1997) Pgs. 45–49 describes a circular beam scanning method for uniform irradiation over a large area using a beam that follows a spiral trajectory on the target thereby guaranteeing continuous circular irradiation. Scanning speed and trajectory spacing in the radial direction are constant to make particle distribution uniform. The radial position of a beam spot and an angular frequency of the spiral scanning are expressed by an irrational function of time. In those cases where the radial pitch of the spiral trajectory is much smaller than the beam width, uniformity of the particle distribution depends on the ratio of the minimum radius of the trajectory to the beam width.

While these proposed solutions improve the uniformity of the raster or particle beam, they do not produce an optimized result and they rely on the use of relatively expensive and to some extent less than highly reliable components.

Such circular beam sweeping raster pattern generators that require a variation in angular frequency require much higher performance from the driving amplifiers than the system described herein.

Compared with 2-D triangular waveform raster systems that require Hbridges, the system described herein is much more reliable and requires significantly less maintenance.

SUMMARY OF THE INVENTION

According to the present invention a low cost, highly reliable power amplifier is used in combination with a resonant loop magnet driver system to drive a pair of X-Y magnets according to a phase shifting function to generate a pseudo spiral beam pattern that produces an extremely uniform or homogeneous particle beam pattern. Thus the system of the present invention embeds a homogeneous amplitude function proportional to $(t)^{1/2}$ in a function generator or uses a triangular current source to bias a diode generating an approximate $(t)^{1/2}$ voltage output signal. A main waveform generator produces a major driving sinusoidal waveform at a constant frequency, and is set to external amplitude modulation mode. The special waveform produced by the function generator or a biased diode circuit sent to the main waveform generator. The modulated waveform is then forwarded to the low-power power amplifier. Power is applied to a resonant loop circuit that steps up the power to the magnet directing the particle beam thereby producing a uniform density circular raster pattern.

In the case where two magnets, x and y, are used to direct the particle beam, the amplitude modulated output from the main generator is split into two channels. The first is fed to the power amplifier for one of the magnets and the second to the power amplifier for the second magnet each with the same amplitude but with a 90° phase shift. Both of the power circuits includes a resonant loop.

The resultant raster pattern is a round shape with very uniform density when linear driving amplifiers are used to power the X and Y magnets. In those cases where magnets X and Y are powered by two resonance loops, an adjustment of the symmetry of generator A must be performed to obtain the final uniform raster pattern because of the narrow passing band of the resonance loops.

DETAILED DESCRIPTION OF THE INVENTION

In the generation of a raster pattern, a particle beam is directed through a vacuum tube generally of ceramic construction. The particle beam is in turn directed in a pattern when the vacuum tube passes through one or more "pattern control" magnets that direct the trajectory of the beam to form the desired pattern on an incident surface or object. The magnets are normally powered by a relatively high-energy power amplifier, e.g. one producing on the order of 2000 or more watts. The particle beam pattern is generated by a function generator of one type or another acting on the output of the power amplifier. Such devices and their operation are well known to the skilled artisan.

According to the present invention, a conventional particle generation and magnet configuration are used in combination with a relatively low-power power amplifier, e.g. about 250 watts, a resonant loop magnet driver system, an amplitude modulator that induces a homogeneous amplitude function proportional to $(t)^{1/2}$ and when individual X and Y magnets are used a precision phase shifter that induces a 90° phase shift in the applied power to produce a circular raster pattern of virtually uniform density.

Figure 1:
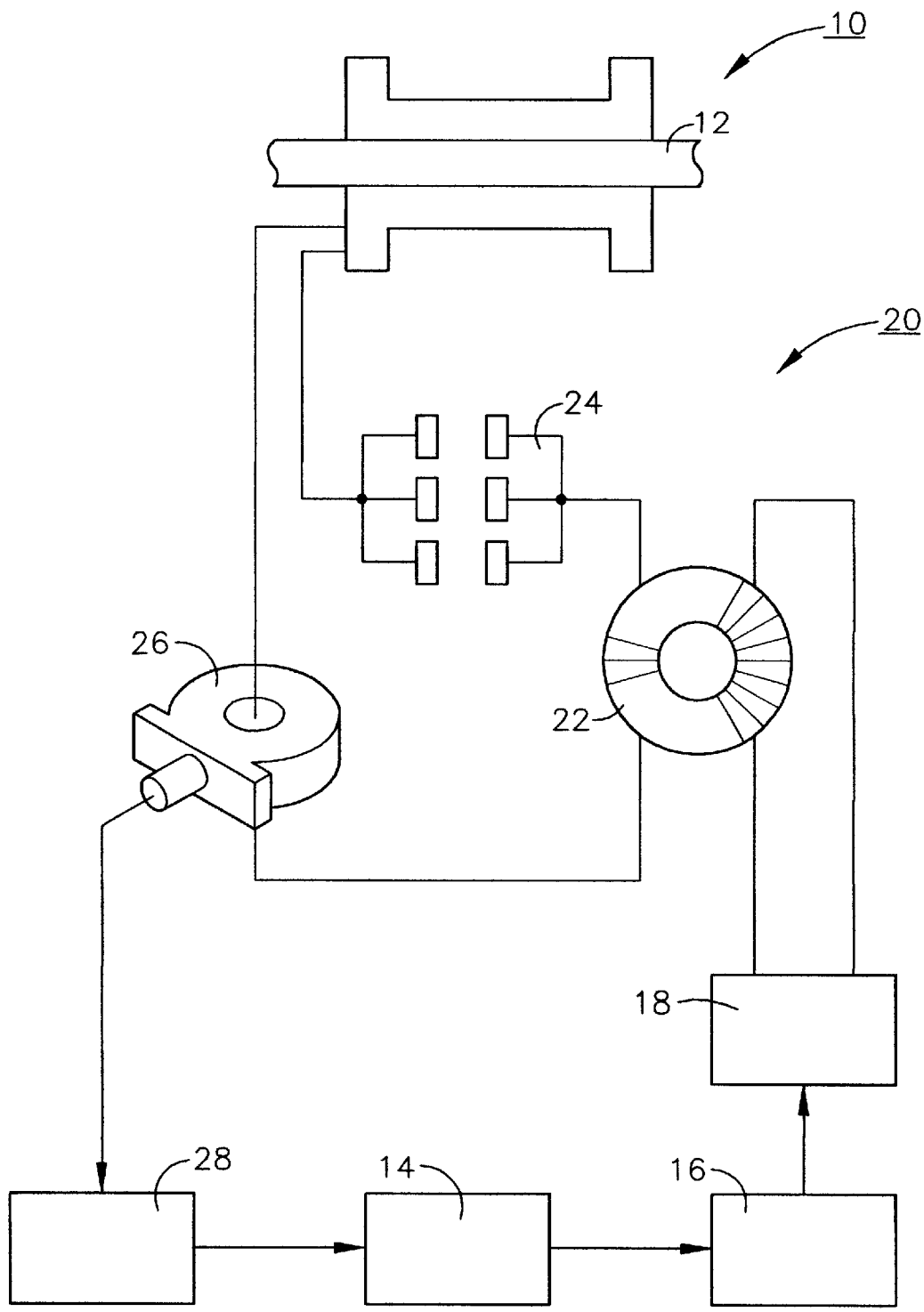
FIG. 1 is a schematic diagram of the resonant mode current driver electronics of the present invention.

As shown in FIG. 1, the uniform density raster system of the present invention comprises a magnet 10 having a vacuum tube 12, preferably of a graphitic material, passing therethrough. Controller 14, either a PLC (programmable controller) or computer is connected to function generator 16 that is in turn connected to power amplifier 18. According to a preferred embodiment of the present invention, power amplifier 18 is a low power amplifier on the order of about 250 watts such as an audio amplifier. Low power amplifier 18 is in turn connected to resonant mode amplifier circuit 20 whose components and operation will be described hereinafter. The foregoing circuit drives magnet 10 to direct the particle beam within vacuum tube 12.

Resonant mode amplifier circuit 20 comprises an impedance converter 22, and a capacitor bank 24 and includes a current probe or sensor 26 that supplies current measurements in watts to controller 14 preferably via a circuit protective device 28.

Resonant transducers, transformers or amplifiers capable of stepping up an input voltage are well known in the art. It is similarly well known that such devices will operate most efficiently, i.e. produce the most or optimum gain at their resonant frequency. Such resonant amplifiers are useful in situations where it is necessary or desirable to drive an electronic device with a relatively high voltage while it may be desirable to power such a device with a relatively low voltage. As the load increase on such amplifiers, impedance increases with a concomitant decrease in gain.

The inductance of the resonant loop, in this case wire magnet 10, resonant capacitors 24 and the respective resistances of these two devices form the resonant or tunable circuit 20. When a constant voltage of varying frequency is applied to such a circuit, the current that flows depends upon the frequency of the applied voltage. At low frequencies the capacitive resistance of the circuit is large and the inductance is small Most of the voltage drop is then across the capacitor while the current is small and leads the applied voltage by about 90°. At high frequencies, the capacitive resistance is small and the inductive reactance is large, resulting in a small current that lags nearly 90° behind the applied voltage, most of the voltage drop being across the inductance, in the instant case, magnet 10.

In between these two extremes, there is a frequency called the resonance frequency at which the capacitive and inductance reactances are equal and consequently tend to neutralize each other. At this frequency, there is only the DC resistance of the circuit to oppose the flow of current. The current at the resonant frequency is accordingly equal to the applied voltage divided by the circuit resistance and is very large, if the resistance is low.

The characteristics of a series resonant circuit depend primarily upon the ratio of the inductive reactance $\omega L$ (wherein $\omega=2\pi f$ (f being frequency) and L=inductance) to circuit resistance R, i.e. upon $\omega L/R$, which is commonly referred to as the quality factor Q. Q can also be defined as $Q=2\pi$ (energy stored in the loop/energy dissipated in the circuit during one cycle.

In a resonant loop most of the loss is due to coil resistance because the losses in a properly constructed capacitor are small in comparison to those of a coil. The result is that the loop Q approximates Q for the coil alone. At 20 kHz operational frequency, the zero-load Q value of resonant capacitor 24 of the system of the present invention is above 1000, and the Q value of magnet 10 is about 100.

At resonance, where the circuit current is E|R, the voltage across the inductance, magnet 10, is Q x the applied voltage, i.e. there is a resonant rise in voltage in circuit 20 amounting to Q times. Since the experimental raster resonance loop 20 demonstrates a Q value on the order of 100, a series resonant circuit will develop a high voltage even with a small applied voltage.

At resonance, the voltage across capacitor 24 and the inductance, magnet 10, are both much greater than the applied voltage from power amplifier 18 because, at frequencies near resonance the voltage across capacitor 24 and inductance 10 are nearly 180° out of phase with each other and add up to a voltage value that is much smaller than either voltage alone.

An interesting characteristic of such a circuit is that in the case of a power interruption, the resonant loop can continue to operate for about 200 cycles before the current drops to one half. Thus, any external power failure does not stop resonance immediately, the relaxation time within cycles off resonance acting as a strong buffer to triggering of a protective system.

Because of certain special performance factors, polypropylene snubber capacitors are preferably chosen for resonant capacitor 24. Snubber capacitors usually have high zero load Q values (over 1000) and high root mean square (rms) current capability. The dual metallized electrodes of such capacitors are suitable for both their self-heating properties and high peak current carrying capabilities. Thus, such snubber capacitors are preferred for use in capacitor 24.

Since many circuits are analyzed on the basis of their effect on a sine wave or a sum of sine waves, methods have been developed to make this as easy as possible, Sinusoidal signals are usefully presented as phasors, in which the signal is represented as a line segment rotating counterclockwise about the origin in the complex phase.

A load, in the instant case magnet 10, connected across the terminals of a resonant network can be matched to power amplifier 18 in either of two ways. When the load (magnet 10) impedance has the same magnitude and phase angle as an equivalent generator Z, the load is said, "to be matched" to the generator or power amplifier on an image-impedance basis. The term "image" arises from the fact that the impedances on the two sides of the output terminals are images of each other. When the load impedance is not identical to the generator impedance, and it is desired to obtain impedance matching on an image basis, it is necessary to transform the load to the correct impedance to match the generator. This transformation can be achieved with the use of al appropriate network of reactances or, by means of a impedance converter 22.

Alternatively, a load impedance may be matched to a power amplifier in such a way as to make the power delivered to the load a maximum. This is accomplished by making the load impedance the conjugate of the generator impedance. In this case, the load impedance has the same magnitude as the generator impedance, but the phase angle of the load is the negative of the phase angle of the generator impedance. In such a case, the reactive component of the load (magnet 10) is then in series resonance with the reactive component of the generator impedance (impedance converter 22), i.e. the load impedance is the correct value to tune out the generator reactance. The resistance components of the load and generator impedances are then matched on an image-impedance basis. Such impedance matching to obtain maximum power delivered to the load is a common operation. It is carried out by transforming the equivalent series resistance of the load to a value equal to the resistance component of the generator impedance by a suitable impedance converter 22 and the adding reactance to the load (magnet 10) as required to resonate with the generator reactance.

A ferrite toroid transformer 22 is used as impedance converter 22 to match the output impedance of power amplifier 18 and the low input impedance of series resonant mode circuit 20. In order to operate the toroid at about 20 kHz and with high current, a special ferrite toroid with a high AL (amperage x impedance) value, high saturation flux density, low core loss at high temperature and flux levels, excellent permeability stability at high temperature and high flux, and high curie temperature is used as matching impedance converter 22. For example, a toroid having an AL of 5520 mH per 1000 turns is entirely suitable. The ratio of primary winding to secondary winding is 10:1. According to a preferred configuration, two such ferrite toroids with 5.5 cm I.D. are stacked together to increase power capability to 2 kW from the 0.25 kW capability of power amplifier 18. According to a highly preferred embodiment of the present invention, the primary winding is made of 660/38 Litz cable and the low impedance two turn secondary winding is made with 1650/38 Litz cable.

Although any suitable power amplifier 18 may be used in the successful practice of the present invention, useful results directing a 100 $\mu$A particle beam over a 2 mm$^2$ circular area have been achieved using a model HTA-250-A low power audio amplifier available from Bogen Communications, Inc., 50 Spring St., Ramsey, N.J. 07446. This device provides a continuous maximum 250 watt rms output with a frequency response of +/−1 dB from 20 Hz to 20 kHz. It has been found to be a highly reliable unit.

In order to achieve a uniform density in the target area, the formula $\Delta S/\Delta T$=constant must be satisfied. When the phase difference between two sinusoidal signals with the same amplitude equals 90° it will generate a circle. The instant amplitude r(t) in such a case must approximately equal $\sqrt{t}$ or $t^{1/2}$ which is the amplitude function. By embedding this function either in the hardware or software of function generator 16, for example a 10 MHz Wavetek Model 29 DDS, available from Wavetek Corporation, San Diego, Calif., and communicating the same to the aforementioned low-power power amplifier 18, an appropriate amplitude can be imparted to the supplied voltage.

Alternatively, a triangular current source can be used to bias a diode thereby generating an approximate $(t)^{1/2}$ voltage output signal The use of a function generator is, however, preferred because of the accuracy and simplicity of such devices.

Figure 2:
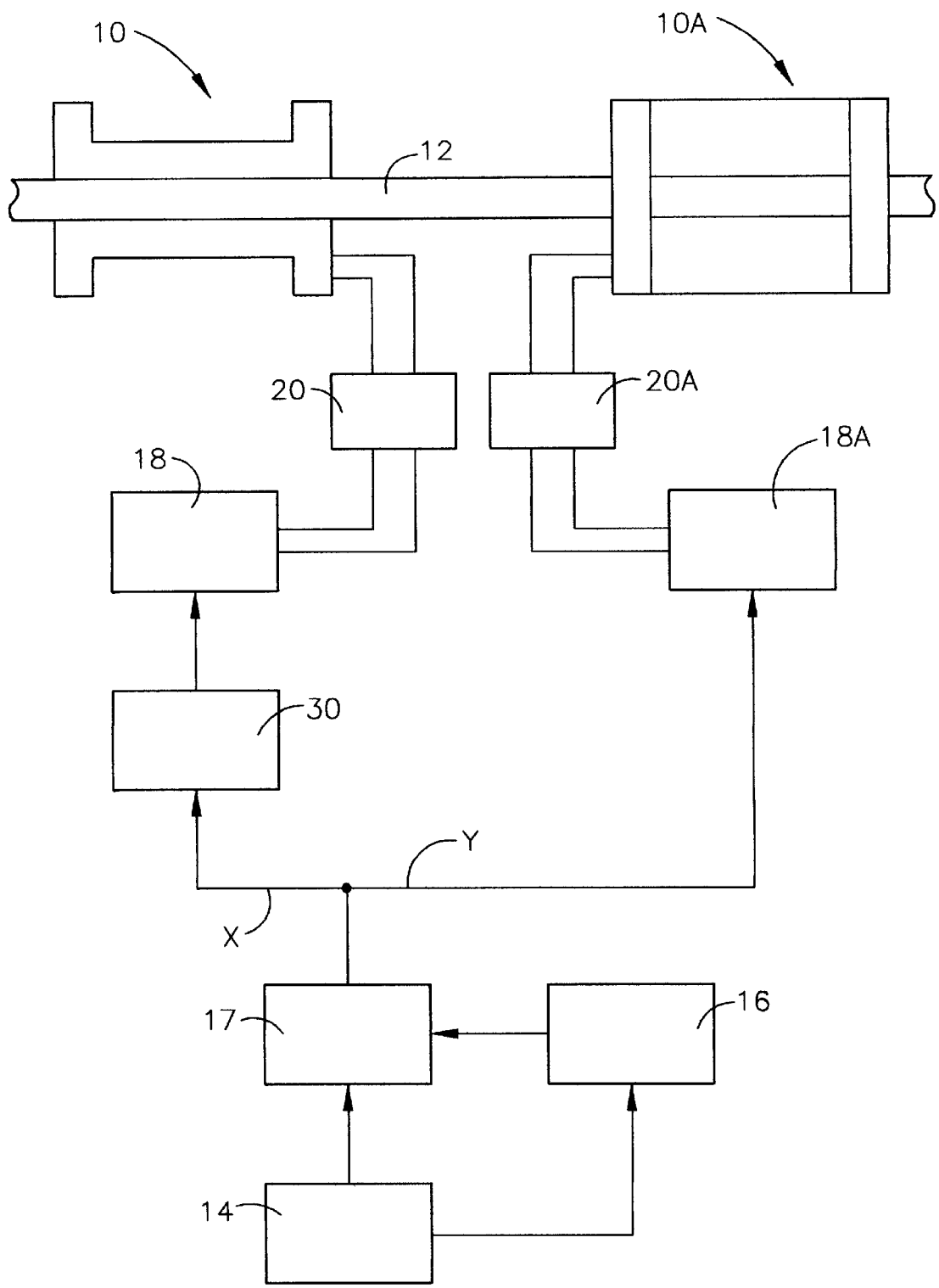
FIG. 2 is a block diagram of fast raster system driven by a pair of magnets each driven by a separate power amplifier incorporating a separate resonance loop.

As shown in FIG. 2, when a pair of x and y magnets 10 and 10A are used to generate the desired circular raster pattern, a pair of power supplies 18 and 18A incorporating resonant circuits 20 and 20A are used to drive the individual magnets 10 and 10A. In this case, waveform generator 17 generates the major driving sinusoidal waveform at a constant frequency. Waveform generator 17 is set to external amplitude modulation mode and the special waveform produced by function generator 16 or a biased diode circuit as described above communicated to generator 17. The amplitude modulated output from waveform generator 17 is split into two channels x and y. The first channel is fed directly into power amplifier 18A while the second channel is sent to power amplifier 18 via a precision phase shifter 30 with the same amplitude but with a 90° phase shift. The resultant raster pattern is a round shape with virtually uniform density distribution.

Because resonance circuits 20 and 20A each act as narrow band pass filters, it may be necessary to make an appropriate adjustment in the symmetry of the amplitude modulation induced by function generator 16 in order to obtain final uniformity of raster density. Such adjustment is well within the knowledge and capability of the skilled artisan.

Thus, there has been described a method and circuitry for obtaining a uniform or homogeneous particle beam pattern for use in any device or application whose operational efficiency relies upon uniform irradiation of a target area.

As the invention has been described, it will be apparent to those skilled in the art that the same may be varied in many ways without departing from the spirit and scope of the invention. Any and all such modifications are intended to be included within the scope of the appended claims.

What is claimed is:

1. A uniform density raster pattern generating system comprising:
    A) a particle beam generator;
    B) at least one magnet directing the trajectory of a particle beam generated by said particle beam generator;
    C) a magnet powering circuit comprising;
        i) a low-power power amplifier driving each of said at least one magnet;
        ii) a resonant mode amplifier circuit between said low-power power amplifier and said at least one magnet for stepping up power from said power amplifier to said at least one magnet; and
        iii) a device selected from the group consisting of: a) an amplitude modulator; and b) a triangular current source biasing a diode, that induces a homogeneous amplitude function proportional to $(t)^{1/2}$ on the waveform of power supplied from said power amplifier; and
    D) a control device that serves to maintain the balance of said magnet powering circuit.

2. The uniform density raster pattern generating system of claim 1 wherein said resonant mode amplifier circuit comprises in series with said magnet and said power amplifier;
    A) an impedance converter; and
    B) a capacitor bank
operating at resonant frequency.

3. The uniform density raster pattern generating system of claim 2 wherein said impedance converter comprises a toroid transformer.

4. The uniform density raster pattern generating system of claim 3 wherein said toroid transformer is a ferrite toroid transformer.

5. The uniform density raster pattern generating system of claim 4 wherein said toroid transformer is a ferrite toroid transformer having a ratio of primary winding to secondary winding of 10:1.

6. The uniform density raster pattern generating system of claim 5 wherein said ferrite toroid transformer comprises a pair of ferrite toroid transformers each having an I.D. of 5.5 cm stacked together.

7. The uniform density raster pattern generating system of claim 2 wherein said capacitor bank comprises a series of snubber capacitors.

8. The uniform density raster pattern generating system of claim 7 wherein said impedance converter is a toroid transformer.

9. The uniform density raster pattern generating system of claim 7 wherein said snubber capacitors are polypropylene snubber capacitors.

10. The uniform density raster pattern generating system of claim 2 further including a current probe that detects the current flow in said resonant mode amplifier circuit and communicates the same to said control device.

11. The uniform density raster pattern generating system of claim 2 operating at a frequency of about 24 kHz.

12. A uniform density raster pattern generating system comprising:

A) a particle beam generator;
B) a pair of magnets individually directing the trajectory of a particle beam generated by said particle generator in the X and Y directions;
C) a magnet powering circuit comprising;
   i) a device selected from the group consisting of: a) an amplitude modulator; and b) a triangular current source biasing a diode, that induces a homogeneous amplitude function proportional to $(t)^{1/2}$ on the waveform of;
   ii) a main waveform generator output whose signal is split between individual low-power power supplies feeding power via individual resonant mode amplifier circuits to each of said magnets; and
   iv) a precision phase shifting device in one portion of said split signal that shifts the phase of that signal 90°; and
D) a control device connected to said amplitude modulator and said main waveform generator that controls said uniform density particle beam raster system.

13. The uniform density raster pattern generating system of claim 12 wherein each of said resonant mode amplifier circuits comprises in series with said individual magnets and said individual low-power power supplies:
   A) an impedance converter; and
   B) a capacitor bank
operating a resonant frequency.

14. The uniform density raster pattern generating system of claim 13 wherein said impedance converter comprises a toroid transformer.

15. The uniform density raster pattern generating system of claim 14 wherein said toroid transformer comprises a ferrite toroid transformer having a ratio of primary to secondary windings of 10:1.

16. The uniform density raster pattern generating system of claim 15 wherein said ferrite toroid transformer comprises a pair of ferrite toroid transformers each having an I.D. of 5.5 cm stacked together.

17. The uniform density raster pattern generating system of claim 14 wherein said capacitor bank comprises a series of snubber capacitors.

18. The uniform density raster pattern generating system of claim 12 operating at a frequency of about 24 kHz.

19. A method for producing a uniform density raster pattern in a device comprising a particle beam generator and at least one magnet directing the trajectory of a particle beam generated by said particle beam generator comprising the steps of:
   A) generating a homogeneous amplitude function proportional to $(t)^{1/2}$;
   C) feeding said homogeneous amplitude function proportional to $(t)^{1/2}$ to a power amplifier connected to said magnet in series via a resonant mode amplifier circuit so as to control the amplitude of the output of said power amplifier;
   D) powering said magnet with said power amplifier; and
   E) controlling the operation of said magnet using a control device.

* * * * *

UNITED STATES PATENT AND TRADEMARK OFFICE
CERTIFICATE OF CORRECTION

PATENT NO.    : 6,380,545 B1
DATED         : April 30, 2002
INVENTOR(S)   : Chen Yan It is certified that error appears in the above-identified patent and that said Letters Patent is hereby corrected as shown below:

<u>Title page,</u>
Immediately below the title, insert the following paragraph:

-- The United States may have certain rights to this invention, under Management and Operating Contract DE-AC05-84ER40150 from the United States Department of Energy. --

Signed and Sealed this

Twenty-fifth Day of February, 2003

JAMES E. ROGAN
*Director of the United States Patent and Trademark Office*